United States Patent
Sakamoto et al.

(10) Patent No.: US 6,963,126 B2
(45) Date of Patent: Nov. 8, 2005

(54) SEMICONDUCTOR DEVICE WITH UNDER-FILL MATERIAL BELOW A SURFACE OF A SEMICONDUCTOR CHIP

(75) Inventors: Noriaki Sakamoto, Gunma (JP); Yoshiyuki Kobayashi, Gunma (JP); Junji Sakamoto, Gunma (JP); Yukio Okada, Gunma (JP); Yusuke Igarashi, Gunma (JP); Eiju Maehara, Gunma (JP); Kouji Takahashi, Gunma (JP)

(73) Assignee: Sanyo Electric Co., Ltd.

( * ) Notice: Subject to any disclaimer, the term of this patent is extended or adjusted under 35 U.S.C. 154(b) by 19 days.

(21) Appl. No.: 09/809,923

(22) Filed: Mar. 16, 2001

(65) Prior Publication Data

US 2002/0048828 A1 Apr. 25, 2002

(30) Foreign Application Priority Data

Sep. 6, 2000 (JP) ........................ 2000-269464

(51) Int. Cl.⁷ ............................ H01L 23/22; H01L 23/24
(52) U.S. Cl. ........................ 257/687; 257/702; 438/117; 438/128
(58) Field of Search ..................... 257/687, 688, 257/702; 438/117, 125, 128

(56) References Cited

U.S. PATENT DOCUMENTS

| | | | | |
|---|---|---|---|---|
| 5,350,947 A | * | 9/1994 | Takekawa et al. | 257/668 |
| 5,677,246 A | * | 10/1997 | Maeta et al. | 438/118 |
| 5,744,383 A | * | 4/1998 | Fritz | 438/111 |
| 5,814,894 A | | 9/1998 | Igarashi et al. | |
| 5,869,886 A | * | 2/1999 | Tokuno | 257/657 |
| 6,046,077 A | * | 4/2000 | Baba | 438/108 |
| 6,294,831 B1 | * | 9/2001 | Shishido et al. | 257/687 |
| 6,303,998 B1 | * | 10/2001 | Murayama | 257/469 |
| 6,383,846 B1 | * | 5/2002 | Shen et al. | 438/108 |
| 6,410,366 B1 | * | 6/2002 | Hashimoto | 257/778 |

FOREIGN PATENT DOCUMENTS

| | | |
|---|---|---|
| DE | 19532755 C1 | 2/1997 |
| DE | 19819215 A1 | 11/1998 |
| JP | 10-256417 | 9/1998 |
| JP | 10-335566 | 12/1998 |
| JP | 11-163024 | 6/1999 |
| JP | 2000-150760 | 5/2000 |

OTHER PUBLICATIONS

Edward D et al., "Thermal Performance of Tape Based Ball Grid Array Over Molded Packages" *Fourteenth Annual IEEE;* pp. 169–175 (1998).

* cited by examiner

*Primary Examiner*—George Fourson
*Assistant Examiner*—Fernando L. Toledo
(74) *Attorney, Agent, or Firm*—Fish & Richardson P.C.

(57) ABSTRACT

AS conductive patterns 11A to 11D are formed burying in a insulating resin 10 and a conductive foil 20 is formed being half-etched, thickness of the device is made thin. As an electrode for radiation 11D is provided, a semiconductor device superior in radiation is provided.

16 Claims, 6 Drawing Sheets

SEMICONDUCTOR DEVICE WITH UNDER-FILL MATERIAL BELOW A SURFACE OF A SEMICONDUCTOR CHIP

BACKGROUND OF THE INVENTION

1. Detailed Description of the Invention

The present invention relates to a semiconductor device and a method of manufacturing the same, particularly a semiconductor device radiating heat excellently from the semiconductor device and a method for manufacturing the same.

2. Description of the Related

In recent years, use of IC package for portable equipment or small, hi-density mounting equipment progresses, and the conventional IC package and its concept of mounting are largely changing. These details are described in *CSP technology, and mounting material and device supporting the technology*—special issue of DENSHI ZAIRYO (p.22, September 1998).

FIG. 10 is a structure adopting a flexible sheet 50 as an interposer board, a copper foil pattern 51 is put on the flexible sheet through adhesive, and an IC chip is fixed. There is a pad for bonding 53 formed at periphery of the IC chip as the conductive pattern 51. A pad for connecting solder ball 54 is formed through a conductive path 51B formed in one body(integrally) with the pad for bonding 53.

At backside of the pad for connecting solder ball 54, an opening 56 where the flexible sheet is opened is provided, and through the opening 56, a solder ball 55 is formed. The entire body is sealed with an insulating resin 58 using the flexible sheet 50 as a board.

However the flexible sheet 50 provided below of IC chip is very expensive, and there are problems that cost rises, thickness of the package becomes thick, and weight thereof increases.

There is a problem that heat resistance from a back face of the IC chip to a back face of the package becomes large in a supporting board because the supporting board comprises material other than metal. For said supporting board, there is a flexible sheet, a ceramic board, or a printed board. A heat conduction path comprising material superior in heat conduction is the thin metal wire 57, the copper foil 51, and the solder ball 55, the above supporting board has a structure not to radiate fully at driving. Therefore there is a problem that driving current does not flow fully because of temperature rise of IC chip at driving.

SUMMARY OF THE INVENTION

The invention is carried out in view of the above problems, and intends to obtain a reliable semiconductor device having a small package and a good radiation characteristics.

First, the problems are solved by having a pad provided facing to a bonding electrode of a semiconductor chip, an electrode for radiation provided at an arranged area of said semiconductor, said semiconductor chip electrically connected to said pad in face down type, and under-fill material provided on at least a lower face of said semiconductor chip and sealing said semiconductor chip so as to expose a back face of said pad to make in one body.

Second, the problems are solved by having a pad provided facing to a bonding electrode of a semiconductor chip, an electrode for radiation provided at an arranged area of said semiconductor, said semiconductor chip electrically connected to said pad in face down type, under-fill material provided on at least a lower face of said semiconductor chip, and an insulating resin sealing said semiconductor chip so as to expose a back face of said pad and a back face of said under-fill material to make in one body.

Third, the problems are solved by that under-fill material comes up to a side face of the semiconductor chip and fills in a trench between adjacent said pads and a trench between said pad and said electrode for radiation.

Fourth, the problems are solved by having a pad provided facing to a bonding electrode of a semiconductor chip, an external connection electrode provided at a conductive path made in one body with said pad, an electrode for radiation provided surrounded by said external connection electrode, said semiconductor chip electrically connected to said pad in face down type, under-fill material provided on at least a lower face of said semiconductor chip, and a insulating resin sealing said semiconductor chip so as to expose a back face of said external connection electrode and a back face of said under-fill material to make in one body.

Fifth, the problems are solved by having a pad provided facing to a bonding electrode of a semiconductor chip, an external connection electrode provided at a conductive path made in one body with said pad, an electrode for radiation provided being surrounded by said external connection electrode, said semiconductor chip electrically connected to said pad in face down type, under-fill material provided on at least a lower face of said semiconductor chip and sealing so as to expose a back face of said external connection electrode and to make in one body.

Sixth, the problems are solved by that said under-fill material comes up to a side face of the semiconductor chip and fills in a trench between adjacent said pads, a trench between adjacent said conductive paths, and a trench between said external connection electrode and said electrode for radiation.

Seventh, the problems are solved by that a connection means connecting said semiconductor chip and said pad is brazing material, conductive pate, or anisotropic resin.

Eighth, the problems are solved by that side face of said pad comprises a curved structure.

Ninth, the problems are solved by that side face of said pad, the conductive path made in one body with said pad, and the external connection electrode comprise a curved structure.

Tenth, the problems are solved by preparing a conductive foil and half-etching so as to form a conductive pattern in projection;

connecting said conductive pattern and a semiconductor chip in face down type;

filling under-fill material at least between said semiconductor chip and said conductive;

providing a insulating resin at said conductive foil so as to seal said semiconductor chip and said conductive pattern; and exposing a back face of said under-fill material and removing a back face of said conductive foil so as to separate as the conductive pattern.

Eleventh, the problems are solved by preparing a conductive foil and half-etching so as to form a conductive pattern in projection;

connecting said conductive pattern and a semiconductor chip in face down;

filling under-fill material at least between said semiconductor chip and said conductive; and exposing a back face of said under-fill material and removing a back face of said conductive foil so as to separate as the conductive pattern.

Twelfth, the problems are solved by that the device is separated by dicing after separating said conductive pattern.

Thirteenth, the problems are solved by that the conductive pattern becoming a unit is formed in matrix shape at said conductive foil and said semiconductor chip is formed at each unit.

Fourteenth, the problems are solved by that the device is separated between said units by dicing after separating said conductive pattern.

By providing the semiconductor device, it is possible to transfer heat of a semiconductor chip to an electrode for radiation. As a conductive pattern including the electrode for radiation is formed without using a supporting board, it is possible to decrease cost and make thickness of the semiconductor chip thin.

BRIEF DESCRIPTION OF THE DRAWINGS

FIG. 1 is a view describing the semiconductor device of the invention.

FIG. 2 is a view describing the method for manufacturing the semiconductor device of the invention.

FIG. 3 is a view describing the method for manufacturing the semiconductor device of the invention.

FIG. 4 is a view describing the method for manufacturing the semiconductor device of the invention.

FIG. 5 is a view describing the method for manufacturing the semiconductor device of the invention.

FIG. 6 is a view describing the method for manufacturing the semiconductor device of the invention.

FIG. 7 is a view describing the semiconductor device of the invention.

FIG. 8 is a view describing the conductive pattern using for the semiconductor device of the invention.

FIG. 9 is a view describing the semiconductor device shown in FIG. 3.

FIG. 10 is a view describing the conventional semiconductor device.

DESCRIPTION OF THE PREFERRED EMBODIMENTS

First mode for carrying out describing a semiconductor device.

Figure 1A:
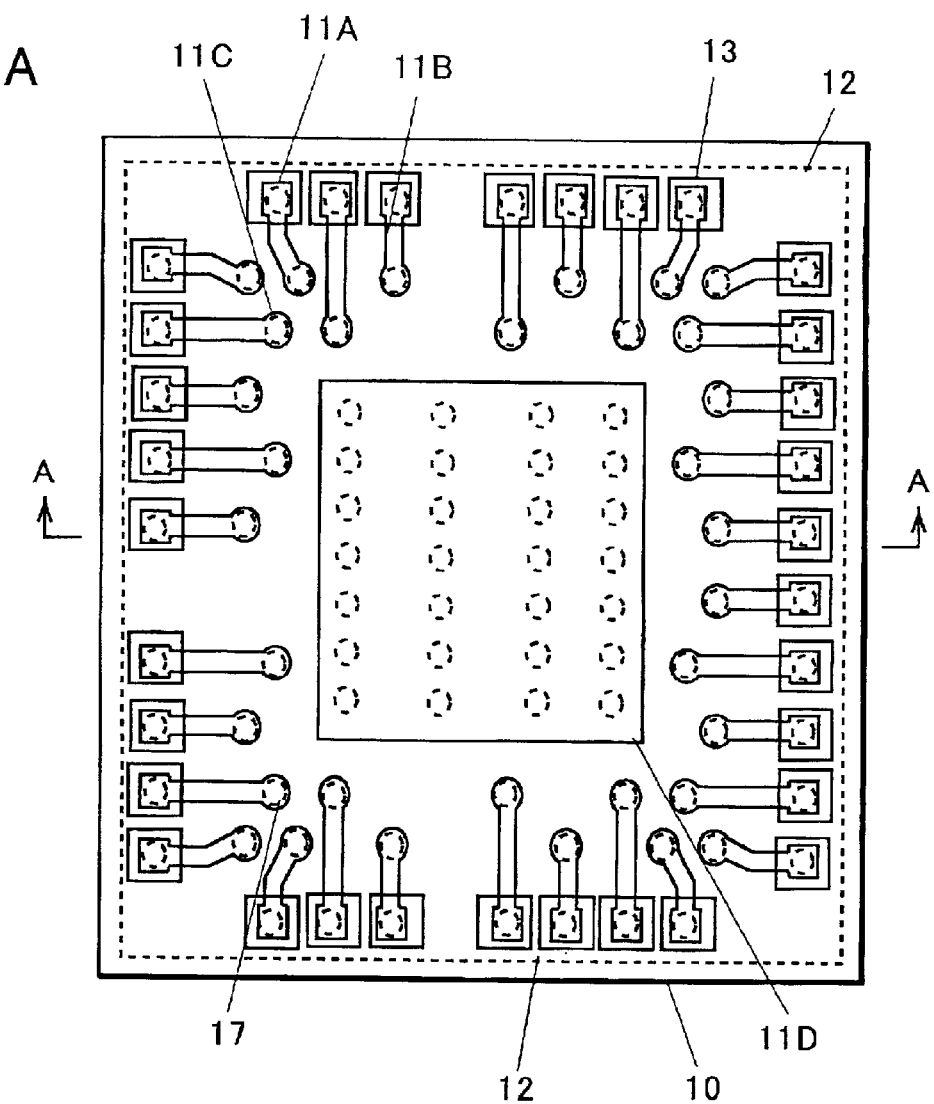
[FIG. 1]
Figure 1B:
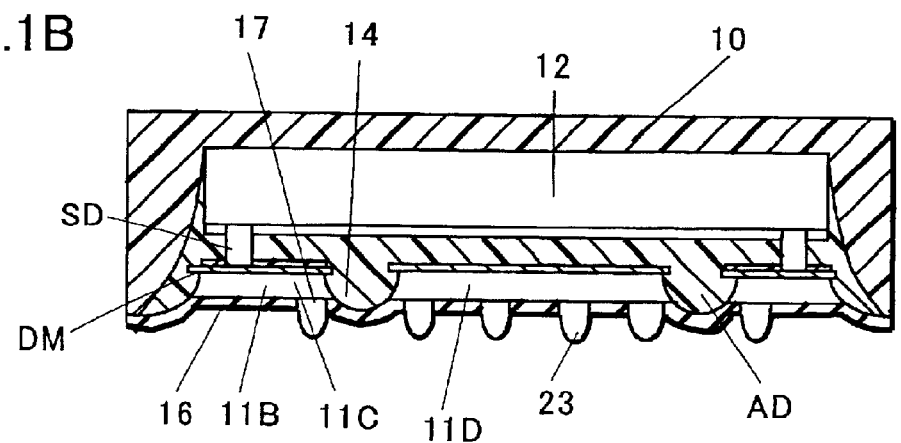
Figure 2:
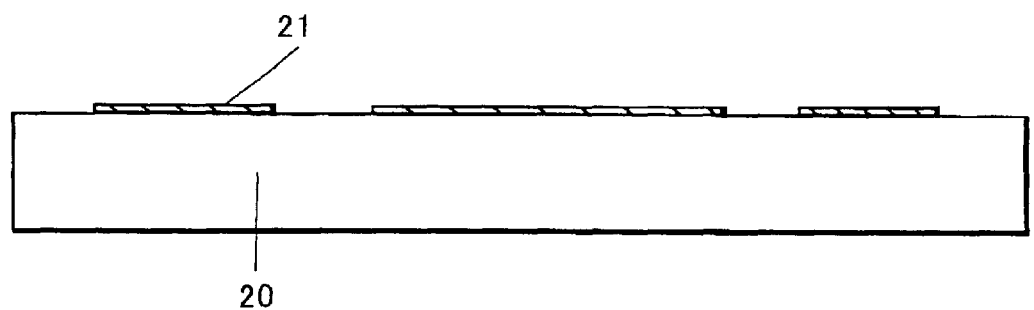
[FIG. 2]
Figure 3:
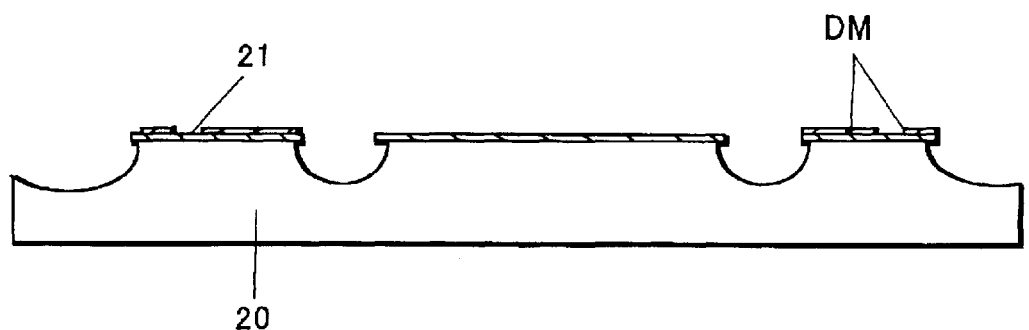
[FIG. 3]
Figure 4:
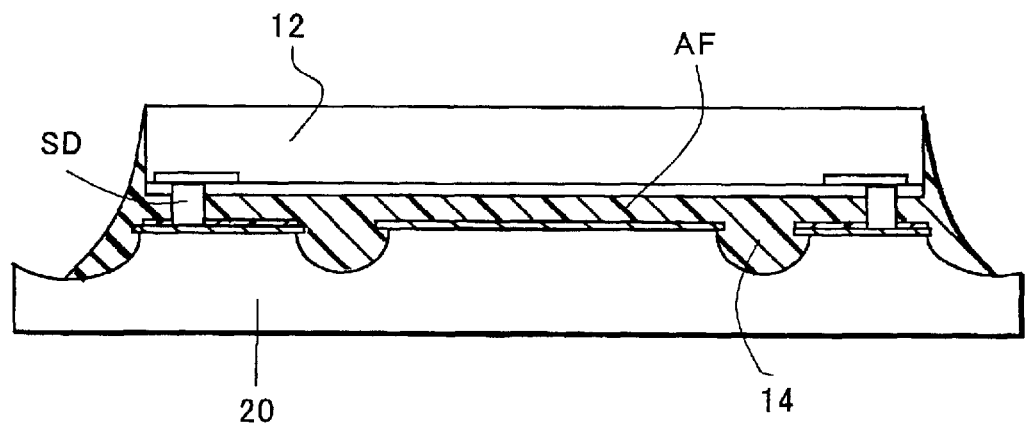
[FIG. 4]
Figure 5:
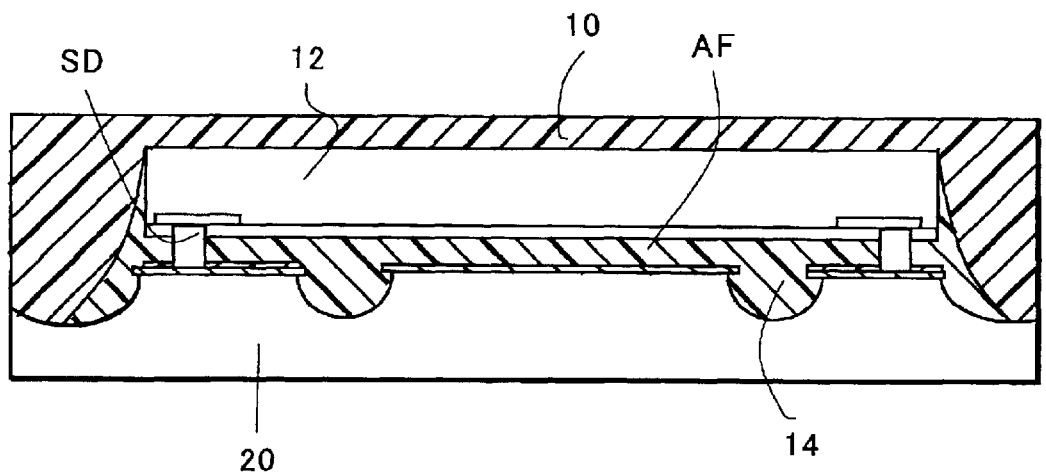
[FIG. 5]
Figure 6:
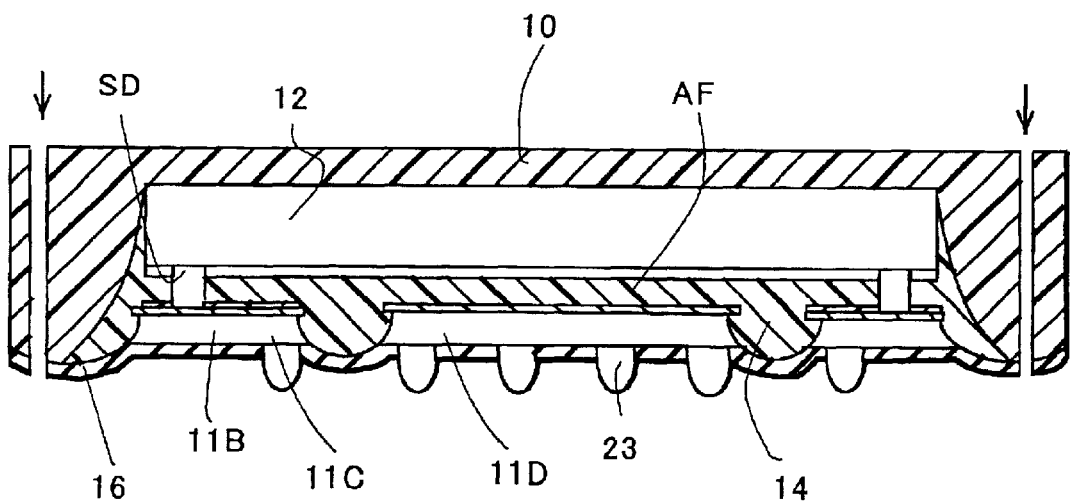
[FIG. 6]

First, a semiconductor device of the invention is described referring FIG. 1 and FIG. 2. FIG. 1A is a plan view of the semiconductor device, and FIG. 1B is a section view cut with A—A line.

In FIG. 1, the following elements are buried in a insulating resin 10: pads 11A, conductive paths 11B in one body with the pads, external connection electrodes 11C provided at the other ends of the conductive paths 11B in one body with the conductive paths 11B. Further an electrode for radiating 11D provided at one area surrounded by the conductive patterns 11A, 11B, and 11C and a semiconductor chip 12 provided on the electrode for radiating 11D are buried. The semiconductor chip 12 is fixed to said electrode for radiating 11D through under-fill material AF, and is shown with dotted line in FIG. 1A.

A bonding electrode 13 of the semiconductor chip 12 and the pad 11A are electrically connected through brazing material SD like solder, conductive paste such as Ag paste, and anisotropic conductive resin because the semiconductor chip 12 is mounted in face-down type.

Side face of said conductive patterns 11A to 11D is etched with non-anisotropy, and has a curved structure because of forming with wet etching so as to generate anchor effect by the curved structure.

The structure consists of four materials: the semiconductor chip 12, plural conductive patterns 11A to 11C, the electrode for radiation 11D, under-fill material AF, and the insulating resin 10 burying them. In arranged area of the semiconductor chip 12, said under-fill material AF is formed at a trench on and between the conductive patterns 11A to 11D, particularly the insulating resin 10 seals at a state that back face of the under-fill material AF filled in the trench 14 and makes a package. Said pads 11A and semiconductor chip 12 are supported by the insulating resin 10 and the under-fill material AF.

The under-fill material AF comprises insulating material possible to infiltrate through a narrow gap, and material spouting to side face of the semiconductor chip 12 is desirable. The under-fill material AF is formed thin at the back face of the semiconductor chip, and the insulating resin 10 may seal the under-fill material AF.

On the other hand, it will be clear by the description of the method for manufacturing below (FIG. 7), the under-fill material AF is formed even to the back face of the semiconductor chip 12 and the semiconductor device may be made omitting the insulating resin 10.

For the insulating resin, thermosetting resin such as epoxy resin and thermoplastic resin such as polyimide resin and polyphenylenesulfide are used. All kinds of resin are used if they are resins hardening using a die and covering by dipping and painting.

For the conductive patterns 11A to 11D, conductive foil of Cu as main material, conductive foil of Al as main material, Fe—Ni alloy, layered product of Cu—Al, or layered product of Al—Cu—Al is used. Of course, even other material is possible to use, particularly conductive material to etch and to evaporate by laser is desirable. Considering half-etching ability, forming ability of plating, and thermal stress, conductive material of Cu as main material formed by (expand with pressurizing such as) rolling is desirable.

Figure 7:
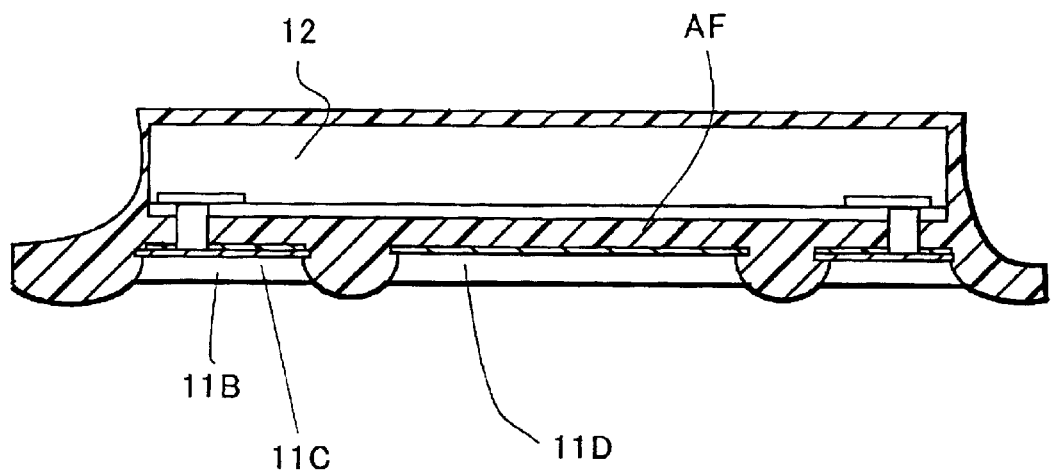
[FIG. 7]

In the invention, the insulating resin 10 and under-fill material AF are filled even in said trench 15 in FIG. 1B, and in FIG. 7, the under-fill material AF is filled even in said trench 15. Therefore the invention has a characteristic to prevent remove of the conductive patterns. By carrying out non-anisotropic etching using dry etching or wet etching for etching, the side faces of pads 11A, the side face of conductive paths 11B, the side face of the external connection electrode 11C, and the electrode for radiation 11D are made into curved structure so as to generate anchor effect. As the result, the structure that the conductive patterns 11A to 11D do not remove from the package is realized.

Further the back face of the conductive patterns 11A to 11D expose at the back face of the insulating resin 10. In FIG. 1B, although a insulating film 16 is formed, the back face of the electrode for radiation 11D may be directly fixed with the electrode on the mounting board omitting the insulating film 16. The structure can radiate heat generating from the semiconductor chip 12 to the electrode of the mounting board; can prevent temperature rise of the semiconductor chip 12, and can increase driving current of the semiconductor chip 12 corresponding to the temperature rise. The electrode for radiation 11D and the semiconductor chip 12 may be electrically connected.

Because the conductive patterns 11A to 11D are supported by insulating resin 10 being sealing resin in the semiconductor device, a supporting board is not need. This construction is a characteristic of the invention. As described at the prior art, the conductive path of the conventional semiconductor device is supported by a supporting board (flexible sheet, printed board, or ceramic board), or supported by a lead frame, the construction which is not need originally is added. However the circuit device comprises necessary minimum components and does not need the supporting board so that the device has a characteristic to be thin, light, and inexpensive because of low material cost.

At the back face of the package, the conductive patterns 11A to 11D expose. By covering brazing material such as solder for example, at the area, the brazing material can get wet thickly because area of the electrode for radiation 11D is broad. Therefore brazing material of the back face of external connection electrode 11C is not wet at the electrode of the mounting board at fixing on the mounting board, so it is assumed to become bad connection.

To solve that, a insulating film 16 is formed at the back face of the semiconductor device 15. In FIG. 1A, circles of dotted line shown at the external connection electrodes and electrodes for radiation show the external connection electrodes 11C and electrodes for radiation 11D exposing from the insulating film 16. That is, as the insulating film 16 covers portions except the circles and size of circle portions is substantially same size, thickness of brazing material formed here is substantially same. This is similar as after solder printing and after reflow. This is similar about conductive paste such as Ag, Au, Ag—Pd and so on. By the structure, bad quality of the electrical connection are suppressed. An exposing portion 17 of the electrode for radiation 11D may be formed larger than exposing size of the external connection electrode 11C considering radiation of the semiconductor chip. As all of the external connection electrodes 11C are substantially same size, all area of the external connection electrodes 11C may be exposed, and a part of the back face of the electrode for radiation 11D may be exposed from the insulating film 16 with substantially same size as the external connection electrode 11C.

By providing the insulating film 16, it is possible to extend the conductive path provided at the mounting board to the back face of the semiconductor device. Although the conductive path provided at the mounting board side is generally is arranged going around the fixed area of said semiconductor device, forming said insulating film 16 can arrange without going around. Further as the insulating resin 10 and under-fill material AF are projected out of a surface level of the conductive pattern, a gap is between the conductive path and the conductive pattern formed so as to prevent short.

Second mode for carrying described a method for manufacturing of a semiconductor device The method for manufacturing shows the method for manufacturing of the semiconductor chip shown in FIG. 1, FIG. 2 to FIG. 6 are section views corresponding to A—A line of FIG. 1A.

First, a conductive foil 20 is provided as FIG. 2. Thickness thereof is desirably 10 $\mu$m to 300 $\mu$m, here rolled copper foil of 70 $\mu$m is used. Next on the front face of the conductive foil 20, a conductive film 21 or a photo resist is formed as etching tolerant mask. The pattern is same pattern as the pads 11A, the conductive paths 11B, the external connection electrode 11C, and the electrodes for radiation 11D. In the case of using the photo resist instead of the conductive film 21, a conductive film such as Au, Ag, or Ni is formed at a part corresponding to at least pad in the lower layer of the photo resist. This is because surface of Cu is easy to oxidize and bad soldering possibly occurs. These films are able to prevent oxidation of Cu and connection of solder. (Refer FIG. 2 about the above.)

Next, the conductive foil 20 is half-etched through said conductive film 21 or photo resist. Depth of etching may be thinner than thickness of conductive foil 20. The thinner the depth of etching, forming the finer pattern is possible.

By half-etching, conductive patterns 11A to 11D appear at surface of the conductive foil 20 in projection shape. As above-mentioned, here Cu foil formed by roll and made of Cu as main material is used for the conductive foil 20. For the conductive foil, conductive foil made of Al, conductive foil made of Fe—Ni alloy, layered product of Cu—Al, or layered product of Al—Cu—Al may be used. Especially the layered product of Al—Cu—Al prevents bend appearing by difference of coefficient of thermal expansion. Rolled copper foil may be used. This is because growth of crystal of X axis and y axis directions is larger than Z axis and is strong in elasticity. Especially although stress added to the conductive path 11B becomes large when the conductive path 11B is formed long, resistance to said stress is improved by using the rolled copper foil. (Refer FIG. 3 about the above.)

Next the bonding electrode 13 and the pad 11A are arranged so as to face each other with face, and are fixed through brazing material for example.

For example, the semiconductor chip 12 having solder ball is provided, and paste comprising brazing material is painted on the pad 11A. Viscosity before baking of the paste makes temporary adhesion of the semiconductor chip 12 possible. Setting in an oven with sate of temporary adhesion, the brazing material is melted so that the semiconductor chip 12 and the pad are electrically connected.

On the other hand, at a part comprising a definite gap with brazing material, under-fill material AF is formed. The under-fill material AF is a material which is easy to fill into a gap between the semiconductor chip 12 and the conductive pattern, and is formed to side or back face of the semiconductor chip 12 by controlling quantity thereof. The under-fill material AF is selected considering adhesiveness of the insulating resin 10 and the conductive pattern.

Therefore the under-fill material AF is provided on a trench 14 between the electrode for radiation 11D and the external connection electrode 11C and a trench 14 between the conductive patterns comprising the pad 11A to the external connection electrode 11C and on them. As above-mentioned, without using supporting board, the semiconductor chip is mounted, and height of the semiconductor chip 12 is arranged low as it is mounted with face down type. Therefore thickness of the package described below is made thin. (Refer to FIG. 4 about the above.)

An insulating resin 10 is formed so as to cover the conductive patterns 11A to 11D formed by half-etching, the semiconductor chip 12. For the insulating resin, both of thermoplasticity and thermosetting property may be used.

Transfer molding, injection molding, dipping, or painting realizes the resin. For the resin material, thermosetting resin such as epoxy resin is realized by transfer molding and thermoplastic resin such as liquid crystal polymer and polyphenylenesulfide is realized by injection molding.

In the mode for carrying out, thickness of the insulating resin is adjusted so as to cover 100 µm upper from the top portion of the semiconductor chip 12. The thickness may be thick or thin considering strength of the semiconductor device.

In the injection of resin, as the conductive patterns 11A to 11D are in one body with the sheet-shape conductive foil 20, position of the conductive patterns 11A to 11D does not shift at all as long as the conductive foil 20 does not shift.

As above-mentioned, in the insulating resin 10 and the under-fill material AF, the conductive patterns 11A to 11D formed as projection and the semiconductor chip 12 are buried, and the conductive foil 20 of lower part than the projection exposes at the back face. (Refer FIG. 5 about the above.)

Next, the conductive foil 20 exposing at the back face of the insulating resin 10 is removed and the conductive patterns 11A to 11D are individually separated.

Various methods are considered for the separating process, that is, the back face may be separated removing by etching or grinding by polishing or grinding. Both of them may be used. There is a problem that shavings of the conductive foil 20 and bur-shape rolled metal extended thin to outside cut into the insulating resin 10 and the under-fill material AF at grinding till the insulating resin 10 exposes for example. Therefore separating the conductive pattern by etching, the device is formed without that metal of the conductive foil 20 cuts into the insulating resin 10 existing between the conductive pattern 11A to 11D and the under-fill material AF. Thus short between the conductive pattern 11A to 11D of fine interval is prevented.

In the case that plural units becoming the semiconductor device 15 are formed, dicing process is added after the separating process.

Although the units are separated individually using the dicing machine here, it is possible by chocolate breaking, pressing, and cutting.

Here the insulating film 16 is formed on the conductive patterns 11A to 11D exposing at the back face separated and is patterned so as to exposes the parts shown in circle of dotted line of FIG. 1A, and after that, it is diced to make the semiconductor device.

The solder 23 may be formed before or after dicing.

The above method for manufacturing realizes a light, thin, short, small package where a semiconductor chip buried in insulating material.

FIG. 7 is an improved semiconductor device of FIG. 1 and the insulating material 10 is omitted. After painting the under-fill material AF so as to form to the back face of the semiconductor chip 12 and solidifying in process of FIG. 4, the device is diced omitting forming the insulating resin 10. In FIG. 7, the back face of the semiconductor chip 12 may be exposed. The plan view of the figure is omitted, as it is same as FIG. 1A.

In all modes for carrying out of the invention, a flow-prevention film is formed so that brazing material SD does not flow. For example of solder, the flow-prevent film DM at a part of at least the conductive patterns 11A to 11C as shown in FIG. 1B so as to resist flow of solder. For the flow-prevent film, bad film in wetting ability with solder, for example, high polymer film or oxide film formed on Ni film is used.

Figure 8:
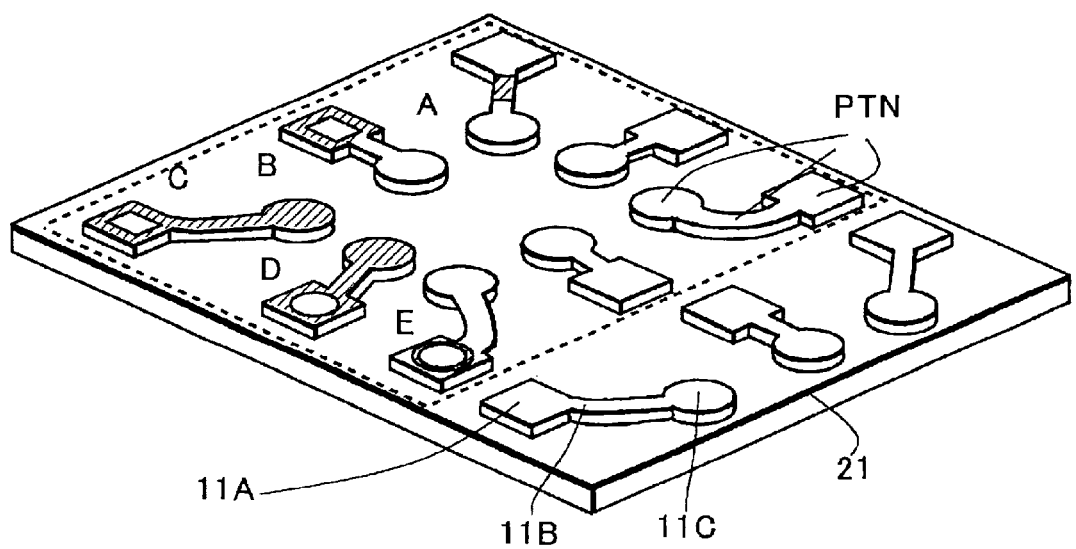
[FIG. 8]

A plan shape of the flow-prevention film is shown in FIG. 8. The electrode for radiation is omitted because of the figure.

Although five patterns of type A to type E are formed in FIG. 8, one of them is selected. In the pattern shown in type A, the flow-prevention film DM is provided at border of the pad 11A and the conductive path 11B, and the electrical connection means is formed at substantially entire area of the pad 11A. The flow-prevention film DM may be formed on an entire area of a conductive path 11B or including the external connection electrode 11C. In type B, the flow-prevention film DM is formed on the pad 11A, and in a part where the electrical connection means is provided, the flow-prevention film DM is removed. In type C, adding to the formed area of type B, the flow-prevention film DM is formed on the conductive path 11B and the external connection electrode 11C. In type D, an opening of the type C is changed to circle from rectangle, in comparison with type C. In type E, the flow-prevention film DM is formed on the pad so as to be a ring shape. Although pat A is shown in rectangle, it may be circle. The flow-prevention film DM prevents flow of brazing material such as solder, conductive paste such as Ag paste, and conductive resin, and these electrical connection means consist of bad material in wetting. For example, in case that solder is provided at type D, when the solder melts, the solder is dammed with flow-prevention film DM so as to form fine hemisphere by surface tension. Because passivation film is formed at periphery of the bonding electrode 13 of the semiconductor chip where the solder is attached, only the bonding electrode gets wet. Therefore by connecting the semiconductor chip and the pad through solder, the both are fixed in adductor shape keeping definite height. As size of the exposing portion and height thereof are possible to adjust by volume of solder provided thereon, a definite gap is provided between the semiconductor chip and the conductive pattern. Therefore it is possible to fill washing liquid into the gap. It is possible to fill adhesive low in viscosity such as under-fill material AF. By covering all area except connecting area with the flow-prevention film DM, it is possible to improve adhesiveness with under-fill material AF.

Next, effect generating by the above method for manufacturing is described.

First, as the conductive pattern is half-etched and supported in one body of the conductive foil, a board used for supporting past is removed.

Second, as the pad half-etched to make projection is formed on the conductive foil, it is possible to make the pad fine. Therefore it is possible to make width and gap of the pad so as to form a small package in plan size.

Third, as the device consists of necessary minimum components: the conductive pattern, the semiconductor chip, the connection means, and sealing material, useless material is removed so as to realize thin semiconductor device extremely depressing cost.

Fourth, as the pads are formed becoming projection by half-etching and individually separated after sealing, tie bar and hanging lead are not need. Therefore forming and cutting tie bar (hanging lead) is not need at all in the invention.

Fifth, as the conductive foil is removed from the back face of the insulating resin after the conductive pattern becoming the projection is buried in the insulating resin and is separated, bur of resin generating between leads as the conventional lead frame is removed.

Sixth, as the semiconductor is fixed to the electrode for radiation through the under-fill material and the electrode for radiation exposes from the back face thereof, heat generating from the semiconductor device is efficiently radiated from the back face thereof. By mixing the insulating adhesion means with filler such as Si oxide film and aluminum oxide, radiation of the device is more improved. By unifying diameter of the filler, it is possible to uniform a gap between the semiconductor chip 12 and the conductive pattern.

Third mode for carrying out describing a semiconductor device.

Figure 9A:
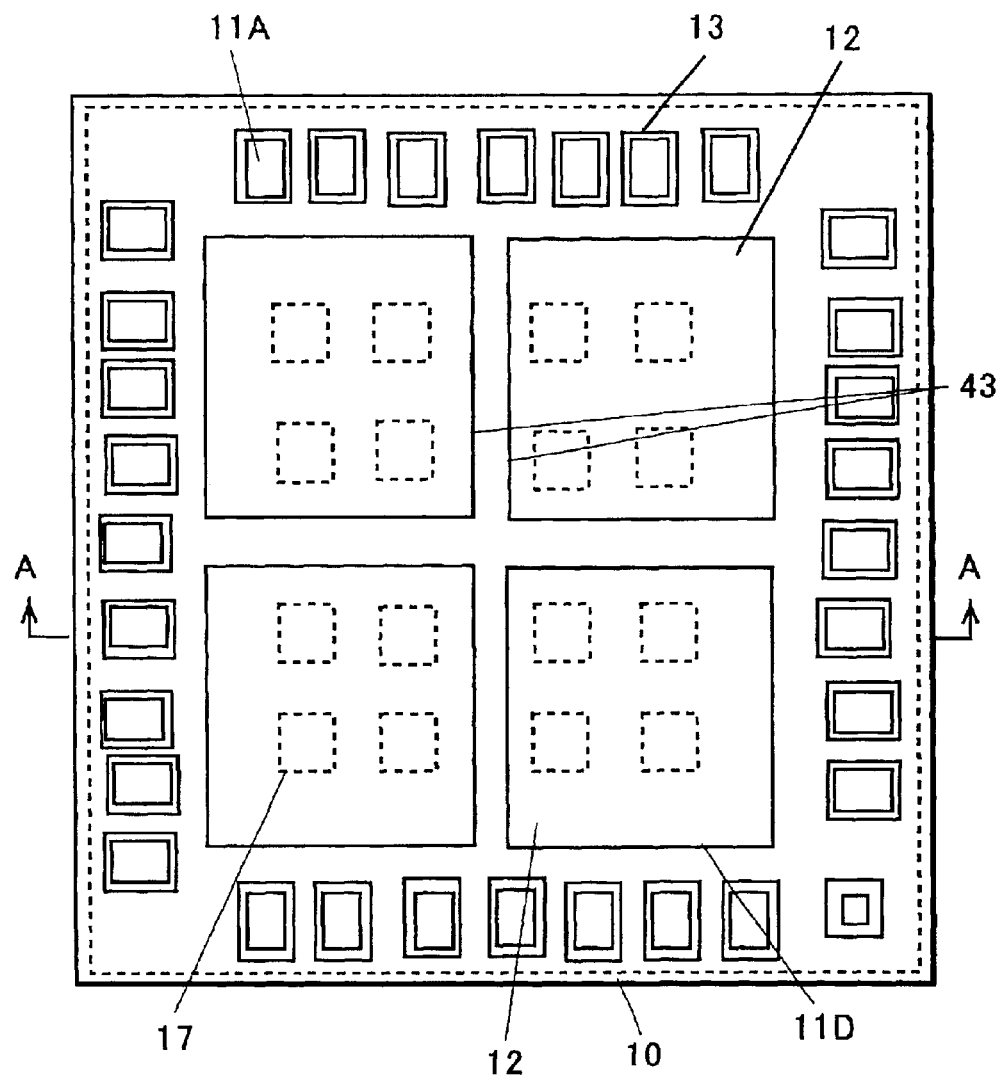
[FIG. 9]
Figure 9B:
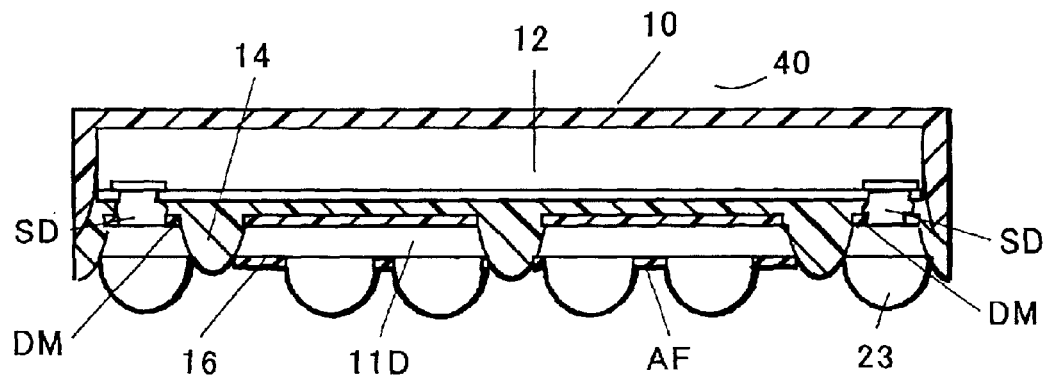
Figure 10A:
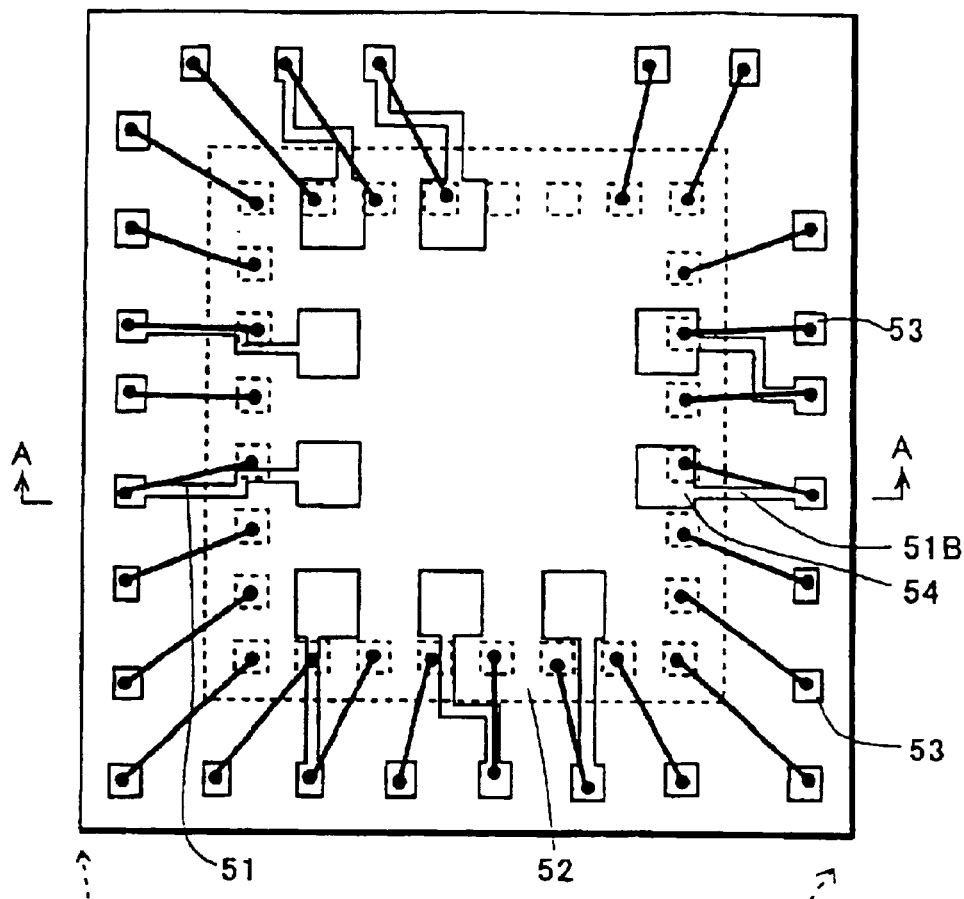
[FIG. 10]
Figure 10B:
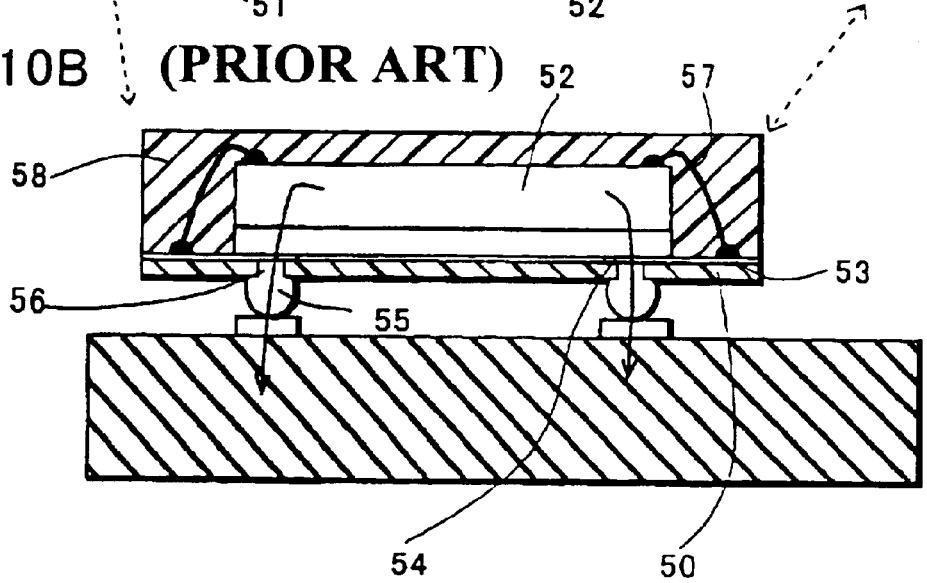

FIG. 9 shows the semiconductor device 40. FIG. 9A is a plan view of the device, and FIG. 9B is a section view cut by A—A line.

Although the pad 11A is formed in one body with the conductive path 11B and the external connection electrode 11C in FIG. 1, here the back face of the pad 11A becomes the external connection electrode.

As the back face of the pad 11A is formed in rectangle, the pattern exposing from the insulating film 16 is formed in same pattern as said rectangle. The grooves 43 are formed so that the electrode for radiation 11D is divided to plural considering adhesion with the under-fill material AF.

As clear from the above description, the invention has a reliable construction without a supporting substrate, since the conductive foil where the conductive pattern formed in island shape has certain thickness (or the conductive foil) is buried by the insulating connection means and the insulating resin. AS the electrode for radiation positioning at the back face of the semiconductor chip exposes, radiation of the semiconductor chip is removed. Further as the supporting board is not used, a thin and light package is realized.

The device consists of necessary minimum components of the conductive pattern, the semiconductor chip, and the insulating resin, and becomes a circuit device useless for resources. Therefore there is not any extra components till completion so as to realize a semiconductor device decreasing cost extremely.

What is claimed is:

1. A semiconductor device comprising:
   a semiconductor chip having bonding electrodes;
   a plurality of pads, each pad facing a respective bonding electrode of the semiconductor chip, the semiconductor chip coupled in a face down position to the pads;
   an under-fill material provided at least below a lower face of the semiconductor chip;
   an insulating resin disposed over an entire upper surface of the semiconductor chip and sealing the semiconductor chip such that the insulating resin covers at least part of the under-fill material; and
   a trench between adjacent pads that extends lower than a bottom surface of the pads.

2. A semiconductor device according to claim 1, further comprising:
   a conductive path integrally connected with a respective pad; and
   an external connection electrode provided to the conductive path, wherein the under-fill material is provided at least at a lower face of said semiconductor chip while exposing a back face of said external connection electrode.

3. A semiconductor device according to claim 1, further comprising:
   a connection means connecting said semiconductor chip, and each of said pads being a brazing material, conductive paste, or anisotropic resin.

4. A semiconductor device according to claim 1, wherein a side face of said pads comprises a curved structure.

5. A semiconductor device according to claim 1, further comprising an electrode for heat radiation provided below said semiconductor chip, wherein said under-fill material is at least between the lower face of said semiconductor chip and the electrodes and beside the electrodes.

6. A semiconductor device according to claim 5, wherein said under-fill material comes up to a side face of the semiconductor chip and fills in a trench between adjacent pads and a trench between said pad facing the bonding electrode and said electrode for heat radiation.

7. A semiconductor device according to claim 5, further comprising:
   a conductive path integrally connected with said pad;
   an external connection electrode provided to the conductive path, the external connection electrode surrounding the electrode for heat radiation,
   wherein said insulating resin seals said semiconductor chip, while exposing a back face of said external connection electrode and a back face of said under-fill material.

8. A semiconductor device according to claim 7, wherein said under-fill material comes up to a side face of the semiconductor chip and fills in a trench between adjacent said pads, a trench between adjacent said conductive paths, and a trench between said external connection electrode and said electrode for heat radiation.

9. A semiconductor device according to claim 3, wherein a side face of said pad, the conductive path integrally connected with said pad, and the external connection electrode have a curved structure.

10. A semiconductor device according to claim 1, wherein the insulating resin is disposed over and seals said semiconductor chip while leaving a back face of said pads and a back face of said under-fill material without the insulating resin.

11. The semiconductor device of claim 1 wherein the trench is filled with the under-fill material.

12. The semiconductor device of claim 1 wherein a bottom surface of the semiconductor chip device is covered by an insulating film with openings, each of which has substantially the same shape, and wherein the pads are exposed from the openings.

13. The semiconductor device of claim 1 wherein the under-fill material is formed separately from the insulating resin.

14. A semiconductor device comprising:
   a semiconductor chip oriented in a face-down position and having electrical contacts on a bottom face adapted for coupling to conductive paths;
   a heat radiating pad separated by a gap from the semiconductor chip bottom face and electrically separated from the conductive paths by a trench that extends lower than a bottom surface of the heat radiating pad and a bottom surface of the conductive paths, and
   an under-fill material provided at least below the lower face of the semiconductor chip and filling the gap,
   wherein the under-fill material supports the semiconductor chip, the heat radiating pad and the semiconductor chip.

15. The semiconductor device of claim 14, wherein an insulating resin is disposed over an entire upper surface of the semiconductor chip and seals the semiconductor chip.

16. A semiconductor device comprising:
- a semiconductor chip oriented in a face-down position and having electrical contacts on a bottom face adapted for coupling to conductive paths;
- a heat radiating pad separated by a gap from the semiconductor chip bottom face and electrically separated from the conductive paths;
- a trench that extends lower than a lower surface of the heat radiating pad;
- an under-fill material provided at least below the lower face of the semiconductor chip and filling the both the gap and the trench;
- an insulating resin on an entire upper surface of the semiconductor chip and sealing the semiconductor chip,
- wherein the under-fill material fills the trenches and the gap between the lower face of the semiconductor chip and an upper surface of the heat radiating electrode.

* * * * *